United States Patent
Mihajlovic et al.

(10) Patent No.: US 10,134,457 B1
(45) Date of Patent: Nov. 20, 2018

(54) CROSS-POINT SPIN ACCUMULATION TORQUE MRAM

(71) Applicant: SanDisk Technologies LLC, Plano, TX (US)

(72) Inventors: Goran Mihajlovic, San Jose, CA (US); Jordan Katine, Mountain View, CA (US); Neil Robertson, Palo Alto, CA (US); Neil Smith, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/692,920

(22) Filed: Aug. 31, 2017

(51) Int. Cl.
*G11C 11/00* (2006.01)
*G11C 11/16* (2006.01)
*H01L 27/22* (2006.01)

(52) U.S. Cl.
CPC ........ *G11C 11/161* (2013.01); *G11C 11/1673* (2013.01); *G11C 11/1675* (2013.01); *H01L 27/224* (2013.01)

(58) Field of Classification Search
CPC .............. G11C 11/161; G11C 11/1673; G11C 11/1675; H01L 27/224
USPC ........................................................ 365/158
See application file for complete search history.

(56) References Cited

U.S. PATENT DOCUMENTS

| | | | |
|---|---|---|---|
| 7,483,296 B2 | 1/2009 | Bedeschi et al. | |
| 2008/0310216 A1* | 12/2008 | Miura | H01L 27/228 365/158 |
| 2013/0028011 A1 | 1/2013 | Kitagawa et al. | |
| 2014/0269035 A1 | 9/2014 | Manipatruni et al. | |
| 2015/0200003 A1 | 7/2015 | Buhrman et al. | |

* cited by examiner

*Primary Examiner* — Huan Hoang
(74) *Attorney, Agent, or Firm* — Kunzler, PC

(57) ABSTRACT

Apparatuses, systems, and methods are disclosed for magnetoresistive random access memory. A plurality of read lines are in a read line layer, and a plurality of write lines are in a write line layer. A plurality of spin accumulation lines are in a spin accumulation line layer disposed between a read line layer and a write line layer. Spin accumulation lines may horizontally cross read lines and write lines. A plurality of vertical magnetoresistive random access memory (MRAM) cells may include polarizers and magnetic tunnel junctions. A vertical MRAM cell may include a polarizer coupled between a spin accumulation line and a write line. A vertical MRAM cell may further include a magnetic tunnel junction coupled between a spin accumulation line and a read line, such that the magnetic tunnel junction and the polarizer are vertically aligned.

20 Claims, 12 Drawing Sheets

US 10,134,457 B1

CROSS-POINT SPIN ACCUMULATION TORQUE MRAM

TECHNICAL FIELD

The present disclosure, in various embodiments, relates to magnetoresistive random access memory and more particularly relates to a cross-point architecture for spin accumulation torque magnetoresistive random access memory.

BACKGROUND

Various types of magnetoresistive random access memory (MRAM) store data using magnetic tunnel junctions. A magnetic tunnel junction (MTJ) may include "fixed" and "free" magnetic layers, where a magnetic moment of the free layer may be switched to be parallel or antiparallel to a magnetic moment of the fixed layer. A thin dielectric or barrier layer may separate the fixed and free layers, and current may flow across the barrier layer due to quantum tunneling. A difference in resistance between parallel and antiparallel states allows data to be stored. For example, a low resistance may correspond to a binary "1" and a high resistance may correspond to a binary "0," Alternatively, a low resistance may correspond to a binary "0" and a high resistance may correspond to a binary "1."

In a cross-point memory array, a cell may be accessed using a first conductive line coupled to a row of cells, and a second conductive line coupled to a column of cells. For example, a data value may be read from a cell by applying a voltage to a row line and sensing the current at the column line, to determine the resistance of the cell. However, the current at the column line may be affected by "sneak current" through other cells in the array. Sneak current may disturb data in neighboring cells during a write operation, reduce the reliability of read operations, and increase the overall power consumption (and heat generation) of a memory device. Accordingly, certain memory devices may include switching or selection components such as transistors, Zener diodes, or the like, which limit leakage current through unselected cells. However, selection components may add area to an array, thus decreasing the density of cells and overall storage capacity. Additionally, selection components that limit sneak current during read and write operations may reflect a compromise between desired characteristics for read operations, write operations, and endurance.

SUMMARY

Apparatuses are presented for magnetoresistive random access memory. In one embodiment, a plurality of read lines are in a read line layer. In a certain embodiment, a plurality of write lines are in a write line layer. In a further embodiment, a plurality of spin accumulation lines are in a spin accumulation line layer disposed between a read line layer and a write line layer. In one embodiment, spin accumulation lines horizontally cross read lines and write lines. A plurality of vertical magnetoresistive random access memory (MRAM) cells include polarizers and magnetic tunnel junctions. A vertical MRAM cell includes a polarizer coupled between a spin accumulation line and a write line. A vertical MRAM cell further includes a magnetic tunnel junction coupled between a spin accumulation line and a read line, such that the magnetic tunnel junction and the polarizer are vertically aligned.

Systems are presented for magnetoresistive random access memory. In one embodiment, an MRAM array includes a plurality of read lines. In a certain embodiment, an MRAM array includes a plurality of write lines. In a further embodiment, an MRAM array includes a plurality of spin accumulation lines disposed between read lines and write lines. In certain embodiments, spin accumulation lines are perpendicular to read lines and write lines. In one embodiment, an MRAM array includes a plurality of MRAM cells. In a certain embodiment, MRAM cells include write selectors, polarizers, magnetic tunnel junctions, and read selectors. In one embodiment, write selectors and polarizers are electrically coupled in series between spin accumulation lines and write lines. In a further embodiment, read selectors and magnetic tunnel junctions are electrically coupled in series between spin accumulation lines and read lines. In a certain embodiment, a controller performs read operations and write operations for an MRAM array by controlling voltages for read lines, write lines, and spin accumulation lines.

An apparatus, in another embodiment, includes means for magnetoresistively storing a data value. In a certain embodiment, an apparatus includes means for accumulating magnetic spins adjacent to a means for magnetoresistively storing a data value, to change a stored data value. In a further embodiment, an apparatus includes means for spin-polarizing an electric write current to generate accumulated magnetic spins. In certain embodiments, a means for magnetoresistively storing a data value, means for accumulating magnetic spins, and means for spin-polarizing are vertically aligned in a cross-point magnetoresistive memory array.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
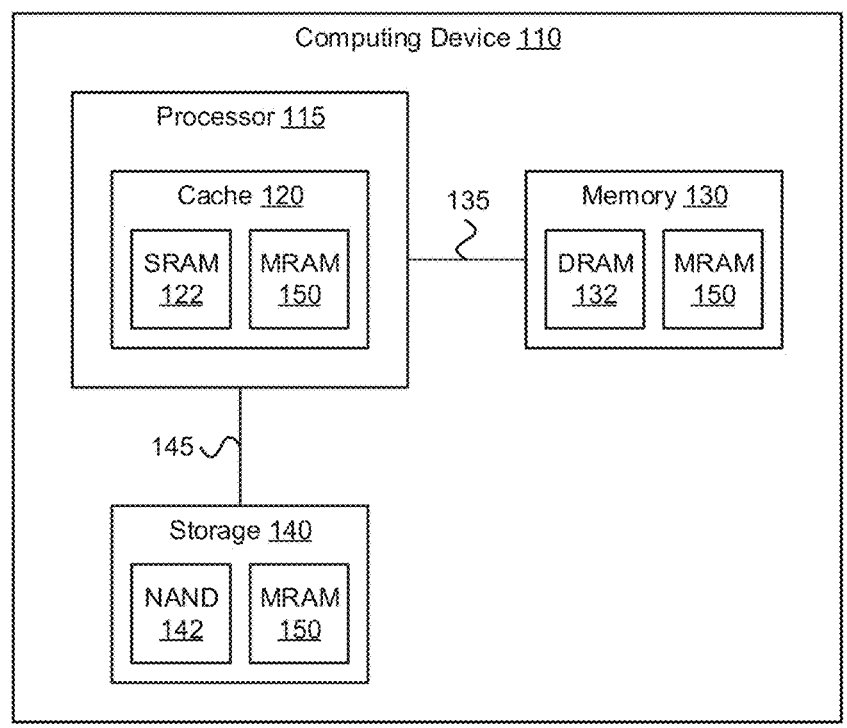
FIG. 1 is a schematic block diagram of one embodiment of a system comprising magnetoresistive random access memory (MRAM)

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 depicts a system 100 comprising magnetoresistive random access memory (MRAM) 150. In the depicted embodiment, the system includes a computing device 110. In various embodiments, a computing device 110 may refer to any electronic device capable computing by performing arithmetic or logical operations on electronic data. For example, a computing device 110 may be a server, a workstation, a desktop computer, a laptop computer, a tablet, a smartphone, a control system for another electronic device, a network attached storage device, a block device on a storage area network, a router, a network switch, or the like. In certain embodiments, a computing device 110 may include a non-transitory, computer readable storage medium that stores computer readable instructions configured to cause the computing device 110 to perform steps of one or more of the methods disclosed herein.

In the depicted embodiment, the computing device 110 includes a processor 115, a memory 130, and storage 140. In various embodiments, a processor 115 may refer to any electronic element that carries out the arithmetic or logical operations performed by the computing device. For example, in one embodiment, the processor 115 may be a general-purpose processor that executes stored program code. In another embodiment, a processor 115 may be a field-programmable gate array (FPGA), an application-specific integrated circuit (ASIC), or the like, that operates on data stored by the memory 130 and/or the storage 140. In a certain embodiment, a processor 115 may be a controller for a storage device (e.g., on a storage area network) a networking device, or the like.

In the depicted embodiment, the processor 115 includes a cache 120. In various embodiments, a cache 120 may store data for use by the processor 115. In certain embodiments, a cache 120 may be smaller and faster than the memory 130, and may duplicate data in frequently-used locations of the memory 130, or the like. In certain embodiments, a processor 115 may include a plurality of caches 120. In various embodiments, a cache 120 may include one or more types of memory media for storing data, such as static random access memory (SRAM) 122, magnetoresistive random access memory (MRAM) 150, or the like. For example, in one embodiment, a cache 120 may include SRAM 122. In another embodiment, a cache 120 may include MRAM 150. In a certain embodiment, a cache 120 may include a combination of SRAM 122, MRAM 150, and/or other memory media types.

The memory 130, in one embodiment, is coupled to the processor 115 by a memory bus 135. In certain embodiments, the memory 130 may store data that is directly addressable by the processor 115. In various embodiments, a memory 130 may include one or more types of memory media for storing data, such as dynamic random access memory (DRAM) 132, MRAM 150, or the like. For example, in one embodiment, a memory 130 may include DRAM 132. In another embodiment, a memory 130 may include MRAM 150. In a certain embodiment, a memory 130 may include a combination of DRAM 132, MRAM 150, and/or other memory media types.

The storage 140, in one embodiment, is coupled to the processor 115 by a storage bus 145. In certain embodiments, the storage bus 145 may be a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 140 may store data that is not directly addressable by the processor 115, but that may be accessed via one or more storage controllers. In certain embodiments, the storage 140 may be larger than the memory 130. In various embodiments, a storage 140 may include one or more types of storage media for storing data, such as a hard disk drive, NAND flash memory 142, MRAM 150, or the like. For example, in one embodiment, a storage 140 may include NAND flash memory 142. In another embodiment, a storage 140 may include MRAM 150. In a certain embodiment, a storage 140 may include a combination of NAND flash memory 142, MRAM 150, and/or other storage media types.

In various embodiments, MRAM 150 may be used to store data in a cache 120, memory 130, storage 140, and/or another component that stores data. For example, in the depicted embodiment, the computing device 110 includes MRAM 150 in the cache 120, memory 130, and storage 140. In another embodiment, a computing device 110 may use MRAM 150 for memory 130, and may use other types of memory or storage media for cache 120 or storage 140. Conversely, in another embodiment, a computing device 110 may use MRAM 150 for storage 140, and may use other types of memory media for cache 120 and memory 130.

Additionally, some types of computing device 110 may include memory 130 without storage 140 (e.g., in a microcontroller) if the memory 130 is non-volatile, may include memory 130 without a cache 120 for specialized processors 115, or the like. Various combinations of cache 120, memory 130, and/or storage 140, and uses of MRAM 150 for cache 120, memory 130, storage 140, and/or other applications will be clear in view of this disclosure.

In various embodiments, the MRAM 150 may include one or more chips, packages, die, or other integrated circuit devices comprising magnetoresistive memory, disposed on one or more printed circuit boards, storage housings, and/or other mechanical and/or electrical support structures. For example, one or more dual inline memory modules (DIMMs), one or more expansion cards and/or daughter cards, a solid-state-drive (SSD) or other storage device, and/or another memory and/or storage form factor may comprise the MRAM 150. The MRAM 150 may be integrated with and/or mounted on a motherboard of the computing device 110, installed in a port and/or slot of the computing device 110, installed on a different computing device 110 and/or a dedicated storage appliance on a network, in communication with a computing device 110 over an external bus, or the like.

The MRAM 150, in various embodiments, may include one or more MRAM die, including one or more MRAM arrays. In certain embodiments, and MRAM array includes read lines in a read line layer, write lines in a write line layer, spin accumulation lines in a spin accumulation layer between the read line layer and the write line layer, with the spin accumulation lines horizontally crossing the read lines and the write lines, and a plurality of vertical MRAM cells for storing data. In further embodiments, a vertical MRAM cell includes a polarizer and a magnetic tunnel junction (MTJ), where the polarizer is electrically coupled between a spin accumulation line and a write line, the MTJ is electrically coupled between the spin accumulation line and a read line, and the MTJ is vertically across the spin accumulation line from the polarizer. MRAM 150 is described in further detail below with regard to FIGS. 2 through 12.

In general, in various embodiments, three-terminal memory cells may provide separate current paths for reading and writing. Using separate current paths for reading and writing may provide increased endurance, compared to two-terminal cells that use the same current path for both reading and writing. However, certain types of three-terminal cells may occupy more area, either for the cell itself or for associated circuitry such as selection components, than two-terminal cells, thus reducing storage capacity. By contrast, in certain embodiments, vertical MRAM cells coupled to read lines, write lines, and spin accumulation lines may provide separate read and write current paths, with a density comparable to two-terminal cells. Additionally, in some embodiments, vertical MRAM cells may include separate read and write selectors on the separate read and write current paths, allowing read selectors to be chosen based on performance for read operations and write selectors to be chosen based on performance for write operations. By contrast, devices that use the same selector for read and write operations may reflect a compromise between read performance and write performance, and may have lower endurance.

Figure 2:
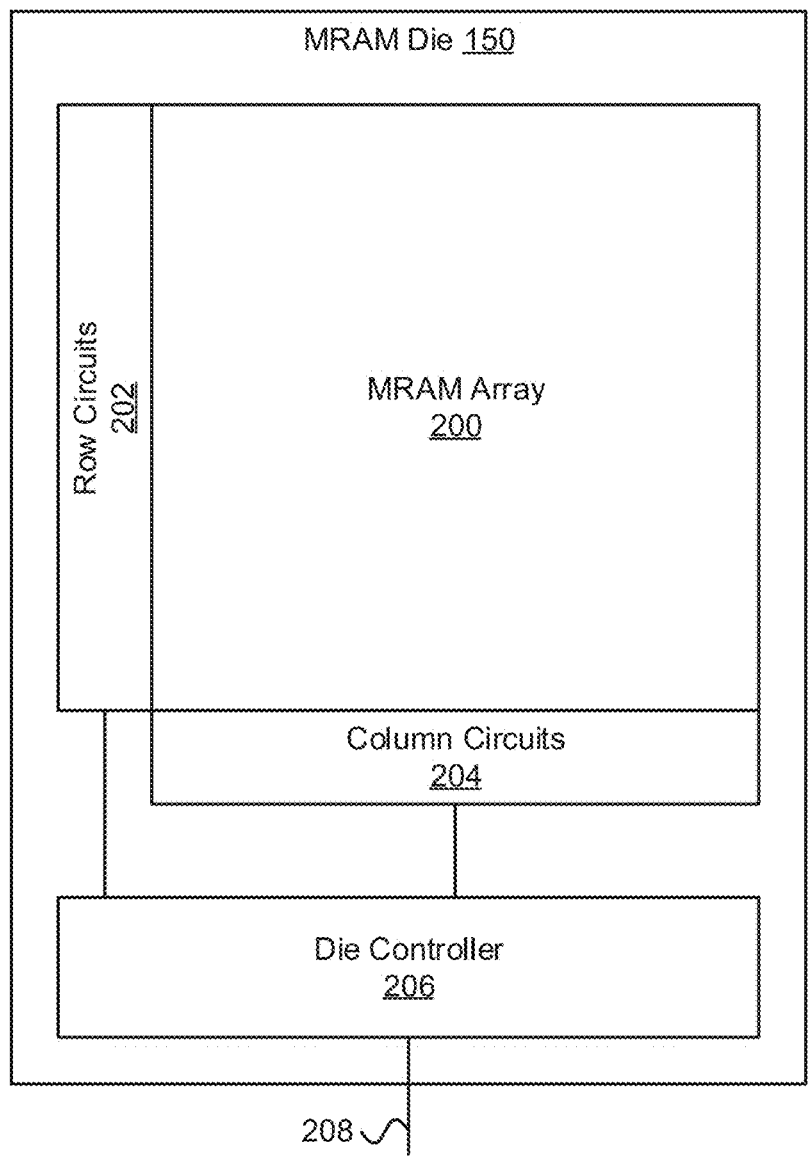
FIG. 2 is a schematic block diagram illustrating one embodiment of an MRAM die.

FIG. 2 depicts one embodiment of an MRAM die 150. The MRAM die 150 may be substantially similar to the MRAM 150 described with reference to FIG. 1. The MRAM die 150, in the depicted embodiment, includes an array 200 of MRAM cells, row circuits 202, column circuits 204, and a die controller 206.

In various embodiments, an MRAM die 150 may refer to an integrated circuit that includes both a core array 200 of MRAM cells (e.g., including MTJs and polarizers) for magnetoresistive data storage, and peripheral components (e.g., row circuits 202, column circuits 204, and/or die controller 206) for communicating with the array 200. In certain embodiments, one or more MRAM die 150 may be included in a memory module, a storage device, or the like.

In the depicted embodiment, the array 200 includes a plurality of MRAM cells for storing data. In one embodiment, the array 200 may be a two-dimensional array. In another embodiment, the array 200 may be a three-dimensional array that includes multiple planes and/or layers of MRAM cells. In various embodiments, the array 200 may be addressable by rows via row circuits 202, and by columns via column circuits 204.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, and the like. The die controller 206 may communicate with a computing device 110, a processor 115, a bus controller, a storage device controller, a memory module controller, or the like, via line 208, to receive command and address information, transfer data, or the like.

Figure 3:
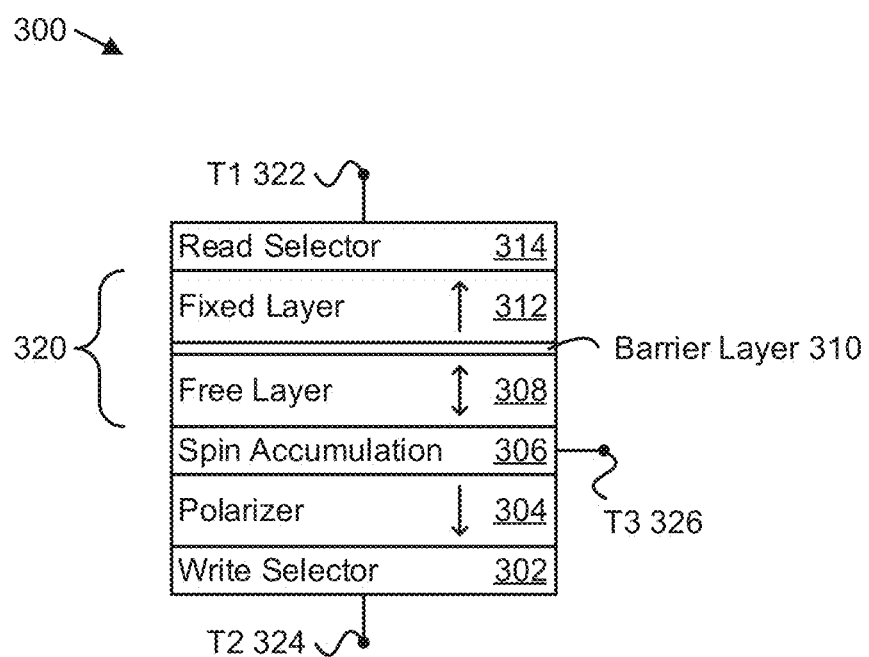
FIG. 3 is a schematic block diagram illustrating one embodiment of a vertical MRAM cell.

FIG. 3 depicts one embodiment of a vertical MRAM cell 300. In various embodiments, the MRAM cell 300 may be part of a plurality of MRAM cells 300 in an MRAM array, such as the array 200 of FIG. 2. In the depicted embodiment, the vertical MRAM cell 300 includes a write selector 302, a polarizer 304, a spin accumulation layer or line 306, a magnetic tunnel junction (MTJ) 320, and a read selector 314. In the depicted embodiment, the MTJ 320 includes a free layer 308, a barrier layer 310, and a fixed layer 312. Three terminals 322, 324, 326 are depicted for convenience in discussing current flows. In certain embodiments, an MRAM cell 300 may include metallic or other conductive terminals 322, 324, 326 for coupling the MRAM cell 300 to lines of a MRAM array 200. In another embodiment, however, lines of an array 200 may be directly coupled to the MRAM cell 300.

In various embodiments, layers of the MRAM cell 300 may be formed or deposited by various techniques such as physical vapor deposition, sputtering, or the like. In certain embodiments, further layers not shown in FIG. 3, such as capping or seed layers, may be included in an MRAM cell 300, or in the process of making an MRAM cell 300.

An MTJ 320, in the depicted embodiment, includes a fixed or reference layer 312 with a fixed or pinned magnetic moment, indicated by a single-headed arrow. In a further embodiment, an MTJ 320 includes a free layer 308, with a magnetic moment that can be changed or switched, indicated by a double-headed arrow. A thin dielectric or barrier layer 310 may separate the fixed layer 312 from the free layer 308, and current may flow across the barrier layer 310 due to quantum tunneling. The probability of an electron tunneling through the barrier layer 310 is higher if the magnetic moments of the fixed layer 312 and the free layer 308 are substantially parallel to each other (referred to herein as the parallel state for the MTJ 320), and lower if the magnetic moments of the fixed layer 312 and the free layer 308 are substantially antiparallel to each other (referred to herein as the antiparallel state for the MTJ 320). Therefore, an electrical resistance through the MTJ 320 may be higher in the antiparallel state than in the parallel state.

In various embodiments, a difference in resistance between parallel and antiparallel states of an MTJ 320 allows data to be stored. For example, a low resistance may correspond to a binary "1" and a high resistance may correspond to a binary "0," Alternatively, a low resistance may correspond to a binary "0" and a high resistance may correspond to a binary "1."

The fixed or reference layer 312, in one embodiment, includes a ferromagnetic material with a fixed or pinned magnetic moment. As used herein, the term "ferromagnetic" may be used to refer to any material capable of spontaneous magnetization (e.g., remaining magnetized in the absence of an externally applied magnetic field). Thus, a "ferromagnetic" material may refer to a strictly ferromagnetic material (e.g., for which individual microscopic magnetic moments are fully aligned), or to a ferrimagnetic material (e.g., for which individual microscopic magnetic moments are partially anti-aligned).

In various embodiments, a "fixed" or "pinned" magnetic moment refers to a magnetic moment that is substantially constant, at least in orientation, when the magnetic moment of the free layer 308 is changed or flipped. Thus, for example, in one embodiment, a fixed layer 312 may comprise a ferromagnetic material with a higher coercivity than a ferromagnetic material of a free layer 308. In such an embodiment, an external magnetic field may change the magnetization of both the fixed layer 312 and the free layer 308, but with a larger effect on the free layer 308. In another embodiment, a fixed layer 312 may comprise a ferromagnetic thin film with a magnetic moment pinned by exchange coupling with an antiferromagnet. For example, in one embodiment, a fixed layer 312 may include a synthetic antiferromagnet (e.g., a cobalt/iron and ruthenium multilayer), a ruthenium or iridium spacer, and a ferromagnetic layer comprising a cobalt/iron/boron alloy (CoFeB).

The magnetic moment of the fixed layer 312, in various embodiments, may provide a reference for the orientation of the magnetic moment of the free layer 308. For example, in various embodiments, the total magnetic moment of the free layer 308 may be parallel or antiparallel to the magnetic moment of the fixed layer 312. Thus, the fixed layer 312 is depicted with a reference magnetic moment indicated by a single-headed arrow, and the parallel or antiparallel magnetic moment of the free layer 308 is indicated by a double-headed arrow.

The barrier layer 310, in various embodiments, is disposed between the fixed or reference layer 312 and the free layer 308. In certain embodiments, the barrier layer 310 comprises a dielectric material, such as magnesium oxide (MgO). In certain embodiments, the barrier layer 310 may be less than 20 angstroms thick, so that quantum tunneling of electrons across the barrier layer 310 allows current to flow through the MTJ 320.

In general, in various embodiments, the free layer 308 may comprise a ferromagnetic material with a magnetic moment that can be changed, switched, or flipped, relative to the magnetic moment of the fixed layer 312. Changing the magnetic moment of the free layer 308 changes the electrical resistance of the MTJ 320, allowing data to be stored. In certain embodiments, a ferromagnetic material of the free layer 308 may include a CoFeB alloy. In some embodiments, the free layer 308 may include multilayers based on transition metals like cobalt and iron, and noble metals such as platinum, palladium, and gold. Some examples include cobalt/palladium, cobalt/platinum and cobalt/nickel. In certain embodiments, reading data may include applying a current from terminal T1 322 to terminal T3 326, to sense the resistance of the MTJ 320

Reading data from an MTJ 320, in various embodiments, may include measuring, detecting, or sensing a resistance of the MTJ 320 (e.g., indicating whether the MTJ 320 is in a parallel or antiparallel state). For example, in one embodiment, a known voltage may be applied across the free layer 308, the barrier layer 310, and the fixed layer 312, and the resulting current may be measured or sensed to detect the resistance. In another embodiment, a known current may be applied through the free layer 308, the barrier layer 310, and the fixed layer 312, and the resulting voltage drop across the MTJ 320 may be measured or sensed to detect the resistance. In certain embodiments, an MRAM array 200 or MRAM die 150 may include sense amplifiers, latches, and the like, to convert a low power signal to a logic level representing a 1 or 0, and store the converted data.

Writing data to an MTJ 320, in various embodiments, may include setting or changing the magnetic moment of the free layer 308 so that the MTJ 320 is in the desired parallel or antiparallel state. Various types of MRAM provide various ways to set the magnetic moment of the free layer 308. In spin-transfer torque (STT) MRAM, data may be written by passing a spin-polarized electrical current through an MTJ 320, to change the magnetic moment of the free layer 308. However, high write currents through the MTJ 320 may accelerate wear of the barrier layer 310, and spin-polarized read currents may disturb or alter the stored data. By contrast, in spin-orbit torque (SOT) MRAM, data may be written by applying an electrical current through a spin Hall effect material adjacent to the free layer 308, thus generating a pure spin current for changing the magnetic moment of the free layer 308. Writing using a pure spin current may improve reliability and data retention compared to STT-MRAM. However, high electrical currents for generating the spin current may lead to design problems relating to heating, high power consumption, large transistor sizes for switching large currents, and the like. Additionally, SOT-MRAM may have larger cell sizes (or lower cell densities) than STT-MRAM due to external bias magnets for switching perpendicular magnetic moments based on in-plane-polarized spin currents, or due to scaling difficulties associated with in-plane magnetic moments for MTJs 320.

In the depicted embodiment, the MRAM cell 300 is a spin accumulation torque (SAT) MRAM cell 300. In an SAT-MRAM cell 300, a spin accumulation layer 306 is electrically connected to the magnetic tunnel junction 320, and a ferromagnetic polarizer 304 is electrically connected to the spin accumulation layer 306. Electrical current passing though the polarizer 304 may become spin-polarized because the polarizer 304 is ferromagnetic. Thus, an electrical current through the polarizer 304 and the spin accumulation layer 306 may result in an accumulation of spins in the spin accumulation layer 306. In certain embodiments, a write current in one direction, from terminal T3 326 to terminal T2 324 may result in spins polarized in one direction accumulating in the spin accumulation layer 306, and a write current in the opposite direction, from terminal T2 324 to terminal T3 326 may result in spins polarized in the opposite direction accumulating in the spin accumulation layer 306.

In a certain embodiment, the spin accumulation layer 306 may be adjacent to or in direct contact with the free layer 308. Thus, spins accumulated in the spin accumulation layer 306 may diffuse vertically into the free layer 308. If of the opposite magnetic polarization direction as that of the free layer 308, such spin diffusion into the free layer 308 may affect the magnetic moment of the free layer 308, so that the MTJ 320 is in the desired parallel or antiparallel state. Accordingly, an SAT-MRAM cell 300 may be set to the parallel or antiparallel state by passing write current through the polarizer 304 and the spin accumulation layer 306 in a first direction for one state, or an opposite direction for the other state.

In various embodiments, SAT-MRAM may provide higher endurance than STT-MRAM, or endurance similar to SOT-MRAM, because write current between terminal T2 324 and terminal T3 326 does not pass through the MTJ 320, and therefore does not cause wear of the barrier layer 310. Additionally, generating spins by polarization (as in STT-MRAM) rather than using the spin Hall effect (as in SOT-MRAM) may provide data storage with lower write currents than SOT-MRAM, and with density (and capacity) similar to STT-MRAM.

In certain embodiments, the polarizer 304 has a fixed direction of magnetization (indicated by a single-headed arrow), and may be positioned in direct contact (or in good electrical contact) with the spin accumulation layer 306. In certain embodiments, the magnetization of the polarizer 304 may be parallel or antiparallel to the magnetization of the fixed layer 312. In further embodiments, the polarizer 304 includes a spin-polarized ferromagnetic material. For example, the polarizer 304 can be an alloy of cobalt and iron, an alloy of cobalt and manganese, or another suitable ferromagnetic material.

In certain embodiments, the spin accumulation layer 306 can be a conductor such as a metal, an alloy, a doped semiconductor, or the like, with high conductivity, long spin diffusion length and good spin mixing interface properties with the polarizer 304 in order to facilitate spin injection and accumulation. Examples of materials that can be used to implement the spin accumulation layer 306 include silver, copper, alloys of silver/copper, aluminum, and/or graphene. Other suitable materials exhibiting long spin diffusion length and/or good spin transparency with the polarizer 304 and the free layer 308 can also be used. Thus, while a spin Hall effect layer for SOT-MRAM may be a (heavy) metal with high spin-orbit coupling (and generally corresponding high resistivity and short spin diffusion length), a spin accumulation layer 306 for an SAT-MRAM cell 300 may be highly conductive material that can readily transport spin current from the polarizer 304 to the free layer 308.

In the depicted embodiment, the spin accumulation layer 306 is shown as a layer within a single MRAM cell 300. However, in various embodiments, a conductive spin accumulation layer 306 may be a portion of a conductive line for accessing the cell 300. For example, in one embodiment, the spin accumulation layer 306 and the terminal T3 326 coupled to the spin accumulation layer 306 may be formed by a single conductive line. In a further embodiment, a single conductive line or plane may be shared as a spin accumulation layer 306 by multiple MRAM cells 300, which may be individually addressed via a read terminal T1 322 for reads, or a write terminal T2 324 for writes. (As described above, read current would be between the read terminal T1 322 and the spin accumulation terminal T3 326, and write current would be in either direction between the write terminal T2 324 and the spin accumulation terminal T3 326.) A spin accumulation layer 306 formed by a conductive line, which may or may not be shared by multiple MRAM cells 300, may equivalently be referred to as a spin accumulation layer 306 when referring to a single cell 300, or as a spin accumulation line when referring to an array 200 of cells 300. SAT-MRAM cells 300, including MTJs 320, spin accumulation layers 306, and polarizers 304, are described in further detail in U.S. patent application Ser. No. 15/440,129 entitled "SPIN ACCUMULATION TORQUE MRAM" and filed on Feb. 23, 2017 for Goran Mihajlovic et al., which is incorporated herein by reference.

In the depicted embodiment, the magnetic moments of the fixed layer 312, the free layer 308, and the polarizer 304 are perpendicular to the barrier layer 310. As used herein, terms such as "in-plane" and "perpendicular" may be used to describe a direction or orientation (e.g., for a vector quantity such as a magnetic moment, magnetization, current density, or the like), relative to a layer of an MTJ 320. In one embodiment, the term "perpendicular" refers to a direction at right angles to a surface of a layer (e.g., vertically in FIG. 3), and the term "in-plane" refers to a direction parallel to a surface of the layer (e.g., horizontally in FIG. 3). In another embodiment, however, a vector, orientation, or direction may include a combination of perpendicular and in-plane components, and but may be described as either "perpendicular" or "in-plane" based on whether the perpendicular component or the in-plane component has a greater magnitude. For example, in one embodiment, where a magnetic moment includes non-zero in-plane and perpendicular components, it may nevertheless be described as an "in-plane" magnetic moment if the in-plane component is greater than the perpendicular component.

In certain embodiments, SAT-MRAM cells 300 with perpendicular magnetization for the fixed layer 312, the free layer 308, and the polarizer 304 may facilitate scalability for high-density arrays 200. However, in another embodiment, an array 200 may include SAT-MRAM cells 300 with in-plane magnetization for the fixed layer 312, the free layer 308, and the polarizer 304. In a further embodiment, an array 200 may include a mixture of perpendicular and in-plane cells 300. However, cells 300 with in-plane magnetization may present scaling difficulties compared to cells 300 with perpendicular magnetization.

In the depicted embodiment, the MRAM cell 300 includes a read selector 314 and a write selector 302. In general, in various embodiments, a selector such as a read selector 314 or a write selector 302 may be a device or component that limits or permits electrical current flow based on whether a voltage satisfies a threshold. The selectors 302, 314 in certain embodiments, may permit an electrical current in response to a voltage satisfying a threshold. Conversely, in various embodiments, the selectors 302, 314 may limit an electrical current, in response to a voltage failing to satisfy a threshold.

In various embodiments, terms relating to current through a selector 302, 314, such as "permitting" and "limiting," "on" and "off," or the like, may be relative terms so that a "permitted" current is significantly higher than a "limited" current. However, a small leakage current may flow when the selector 302, 314 is in the "off" or current-limiting state, and a nonzero resistance may occur when the selector 302, 314 is in the "on" or current-permitting state. For example, a p-n junction diode may be said to be "on" or "permitting" an electrical current when a forward bias voltage exceeds the built-in potential difference of the junction and the slope of the current/voltage curve is high, and may be said to be "off" or "limiting" an electrical current when the forward bias voltage does not exceed the built-in potential difference of the junction and the slope of the current/voltage curve is low, or when a reverse bias voltage (of lower magnitude than a breakdown voltage) does not allow significant current to flow. However, some leakage current may occur when the diode is off. Similarly, a selector 302, 314 may be referred to as "limiting" rather than "permitting" an electrical current even when a small leakage current exists.

In various embodiments, a "threshold" for a voltage may be any voltage that defines, delineates, or corresponds to a boundary between current-limiting and current-permitting states for a selector 302, 314. An applied voltage across a selector 302, 314 may be referred to as satisfying the threshold if the selector 302, 314 permits a current, and as failing to satisfy the threshold if the selector 302, 314 limits a current. In certain embodiments, a selector 302, 314 may permit bidirectional currents (e.g., current in one direction for writing a binary zero to an MRAM cell 300 and in an opposite direction for writing a binary one), and a write selector 302 may have positive and negative voltage thresholds, so that the write selector 302 permits a current in one direction if a positive applied voltage satisfies the positive voltage threshold, and permits a current in the other direction if a negative applied voltage satisfies the negative voltage threshold. In a further embodiment, a bipolar write selector 302 may limit a current for a range of applied voltages between the positive and negative thresholds.

The selectors 302, 314 may include various types of selective material that permit or limit current at different voltages as an inherent characteristic of the material (e.g., for a single-layer selector 302, 314) and/or as a characteristic of an interface between materials (e.g., for a multiple-layer selector 302, 314). For example, in one embodiment, a selector 302, 314 may include a layer of ovonic threshold switching (OTS) material, which permits or limits current based on a phase change, as a single-layer selector 302, 314. In another embodiment, a selector 302, 314 may include alternating layers of n-type and p-type material (e.g., n-p-n, or p-n-p), so that the alternating layers permit a current if a voltage across the forward-biased p-n junction exceeds the built-in potential and a voltage across the reverse-biased p-n junction exceeds the Zener voltage for quantum tunneling, avalanche breakdown, or the like. In certain embodiments, n-type and p-type material may include doped silicon, poly-silicon, oxide semiconductors, or the like. Various selectors 302, 314, such as metal-insulator-metal selectors, mixed ionic-electronic conduction composite selectors, metal-insulator transition selectors using transition metal oxides such as vanadium oxide or niobium oxide, or the like, will be clear in view of this disclosure.

In certain embodiments, the selectors 302, 314 may provide a high on-off ratio (e.g., a ratio of currents between the current-permitting and current-limiting states). For example, an on-off ratio may be 10^7, or greater. In certain embodiments, a high on-off ratio may provide high currents for selected cells 300, with low leakage currents for unselected cells 300.

In general, in various embodiments, a cell 300 of an array 200 may be selected for reading or writing data, and voltages may be applied such that a read selector 314 or a write selector 302 for the selected cell 300 permits a read current or a write current (respectively), in response to an applied voltage satisfying a threshold, while the selectors 302, 314 for cells 300 other than the selected cell 300 limit leakage currents in response to voltages that fail to satisfy thresholds for the selectors 302, 314.

In the depicted embodiment, the read selector 314 is electrically coupled in series with the magnetic tunnel junction 320 in a read current path between terminal T1 322 and terminal T3 326. For example, in an array 200, the read selector 314 may be electrically coupled in series with the magnetic tunnel junction 320 between a spin accumulation line and a read line. In the depicted embodiment, the write selector 302 is electrically coupled in series with the polarizer 304 in a write current path between terminal T2 324 and terminal T3 326. For example, in an array 200, the write selector 302 may be electrically coupled in series with the polarizer 304 between a spin accumulation line and a write line. In the depicted embodiment, the read selector 314 is disposed between the read terminal T1 322 (or a read line of an array 200) and the fixed layer 312 of the MTJ 320, while the write selector 302 is disposed between the write terminal T2 324 (or a write line of an array 200) and the polarizer 304. Thus, the polarizer 304, the spin accumulation layer 306 and the free layer 308 are adjacent, to facilitate spin diffusion into the free layer 308.

In various embodiments, writing to the cell 300 may involve write currents in either direction between the write terminal T2 324 and the spin accumulation terminal T3 326, depending on whether the MTJ 320 is being set to the parallel or the antiparallel state. Thus, in certain embodiments, the write selector 302 may be a bipolar selector that permits current in either direction, in response to a positive or negative voltage satisfying a threshold. In a further embodiment, reading from the cell 300 may involve read currents between the read terminal T1 322 and the spin accumulation terminal T3 326, for sensing the resistance (and therefore the state) of the MTJ 320. The resistance of the cell 300 may be detected based on a read current in either direction. In certain embodiments, the read selector 314 may be a bipolar selector. However, although using both parallel and antiparallel states involves permitting write currents in both directions, a single direction may be selected for a read current, and current may be limited in the other direction. Thus, in certain embodiments, a read selector 314 may be a unipolar selector, which permits current in only one direction, in response to a voltage satisfying a threshold.

In various embodiments, because the SAT-MRAM cell 300 provides separate current paths for read and write operations, read selectors 314 and write selectors 302 may be physically separate devices, separately chosen or configured by a manufacturer based on parameters of read and write operations. For example, read currents may be lower than write currents so as not to disturb the data stored in the cell 300, and may be in a consistent direction. Thus, in one embodiment, a read selector 314 may be a unipolar selector configured for low read currents in one direction, and a write selector 302 may be a bipolar selector configured to permit high write currents in both directions. Certain types of selectors suitable for high, bidirectional write currents may be less suitable for low read currents. Conversely, certain types of selectors suitable for low read currents may also have low endurance if used to permit high bidirectional write currents. Accordingly, devices such as STT-MRAM devices which use the same current path for read and write operations may include a single selector, but the configuration of the selector may reflect undesirable compromises between read performance, write performance, and endurance. By contrast, an SAT-MRAM cell 300 with separate current paths for read and write operations may include a read selector 314 and a separate write selector 302, separately configured for performance and endurance based on parameters of the read and write operations.

In the depicted embodiment, the MRAM cell 300 is vertically aligned. As used herein, a "vertical" direction refers to a direction perpendicular to layers such as the barrier layer 310 (or that has a primarily perpendicular component), and a "horizontal" direction refers to an in-plane or in-layer direction. An MRAM cell 300 may be referred to as a vertical MRAM cell 300 based on vertical alignment of the layers. For example, in one embodiment, the magnetic tunnel junction 320 may be vertically across the spin accumulation layer 306 or line from the polarizer 304, so that the magnetic tunnel junction 320 and the polarizer 304 are on the same vertical axis. Similarly, the read selector 314 and the write selector 302 may be on the same vertical axis as the magnetic tunnel junction 320 and the polarizer 304, so that the read selector 314 and the write selector 302 are vertically aligned with the magnetic tunnel junction 320 and the polarizer 304. Some misalignment of components may occur in the deposition process. For example, edges of the layers may not be perfectly aligned. However, the cell 300 may still be referred to as vertical based on layers such as the selectors 302, 314, the polarizer 304, and the MTJ 320 being disposed in a generally vertical stack.

In certain embodiments, an array 200 of vertical MRAM cells 300 may provide high areal density for the cells 300. For example, the "footprint" area occupied by a vertical cell 300 including selectors 302, 314 and a polarizer 304 may be equal, or approximately equal, to the footprint of an MTJ 320 without further components. By contrast, certain types of MRAM arrays 200 may have larger footprints areas per cell 300, and lower densities, due to including read and write selectors (or transistors) horizontally in a CMOS layer under the cells 300, disposing polarizers 304 at a horizontal distance from MTJs 320 (instead of in vertical alignment) or the like.

Figure 4:
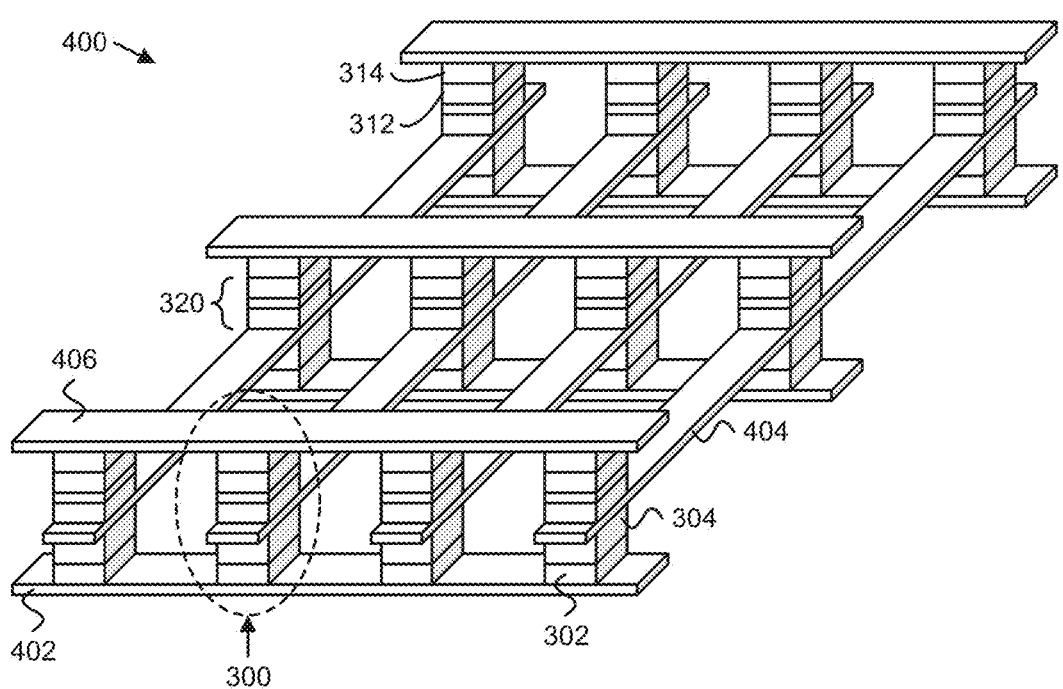
FIG. 4 is a perspective view illustrating one embodiment of an MRAM array.

FIG. 4 depicts one embodiment of an MRAM array 400. In certain embodiments, the MRAM array 400 may be substantially similar to the MRAM array 200 described above with reference to FIG. 2, and may comprise a plurality of MRAM cells 300, which may be substantially as described above with reference to FIG. 3, including MTJs 320, polarizers 304, read selectors 314 and write selectors 302. Additionally, in the depicted embodiment, the MRAM array 400 includes write lines 402, spin accumulation lines 404, and read lines 406.

In general, in various embodiments, a "line" may refer to a conductor such as a metal or polysilicon conductor, that conducts electrical current to or from MRAM cell 300. Additionally, a read line layer, a write line layer, or a spin accumulation line layer may include any layer of read lines 406, write lines 402, or spin accumulation lines 404, respectively. Within a layer, individual read lines 406, write lines 402, or spin accumulation lines 404, may alternate with dielectric material, to prevent shorts between the lines. In FIGS. 4-10, MRAM arrays such as MRAM array 400 are depicted with a small number of MRAM cells 300 for illustrative purposes, and with a correspondingly small number of write lines 402, spin accumulation lines 404, and read lines 406. However, in various embodiments, an actual array may include many more cells 300, write lines 402, spin accumulation lines 404, and read lines 406 than are depicted in the Figures. For example, a gigabyte of MRAM memory may include billions of MRAM cells 300. Similarly, although FIG. 4 depicts a single read line layer, write line layer, and spin accumulation line layer, MRAM arrays 400 in further embodiments may include additional layers of write lines 402, spin accumulation lines 404, and read lines 406 (e.g., in a three-dimensional array)

The MRAM array 400, in the depicted embodiment, includes a plurality of read lines 406 disposed in a read line layer, and a plurality of write lines 402 disposed in a write line layer. In a further embodiment, the MRAM array 400 includes a plurality of spin accumulation lines 404 in a spin accumulation line layer disposed between the read line layer and the write line layer. In various embodiments, the spin accumulation lines 404 may act as spin accumulation layers 306 for cells 300, so that the spin accumulation layer 306 for each cell 300 is a portion of a spin accumulation line 404. Accordingly, in certain embodiments, spin accumulation lines 404 may include high-conductivity material such as silver, copper, aluminum, and/or graphene. In another embodiment, the spin accumulation lines 404 may couple separate or discrete spin accumulation layers 306 for individual cells 300.

In certain embodiments, the MRAM array 400 includes a plurality of vertical MRAM cells 300. A polarizer 304 of an MRAM cell 300 may be electrically coupled between a spin accumulation line 404 and a write line 402. For example, the write line 402 may be coupled to the write selector 302 at the write terminal T2 324. A magnetic tunnel junction 320 of an MRAM cell 300 may be electrically coupled between a spin accumulation line 404 and a read line 406. For example, the read line 406 may be coupled to the read selector 314 at the read terminal T1 322. The magnetic tunnel junction 320 of a cell 300 may be vertically across the spin accumulation line 404 from the polarizer 304, so that the portion of the spin accumulation line 404 between the MTJ 320 and the polarizer 304 functions as a spin accumulation layer 306 for the cell 300. The free layer 308 of the MTJ 320 may be disposed in contact with the spin accumulation line 404 to facilitate spin diffusion into the free layer 308.

In one embodiment, fixed layers 312 may be magnetized in the same direction for a plurality of vertical MRAM cells 300 in an MRAM array 400. In a further embodiment, polarizers 304 may be magnetized in the same direction for a plurality of vertical MRAM cells 300 in an MRAM array 400. In various embodiments, the magnetization of the polarizers 304 may be parallel or anti-parallel to the magnetization of the fixed layers 314. In a certain embodiment, parallel magnetizations of the polarizers 304 and the fixed layers 314 may be set by a one time application of a large perpendicular field.

In general, in various embodiments, a write operation may include passing an electrical current through a polarizer 304 at the intersection of a spin accumulation line 404 and a write line 402. Similarly, a read operation may include passing an electrical current through an MTJ 320 at the intersection of a spin accumulation line 404 and a read line 406. Accordingly, in the depicted embodiment, the MRAM cells 300 are vertical cells 300 (e.g., with vertically aligned write selectors 302, polarizers 304, magnetic tunnel junctions 320, and read selectors 314), and the spin accumulation lines 404 extend in a horizontal direction to horizontally cross the read lines 406 and the write lines 402. Lines may be referred to as horizontally crossing based on the lines crossing through the same vertical space, even if the lines do not actually intersect due to being in different layers. In a certain embodiment, the read lines 406 may be parallel to the write lines 402 (e.g., to address a row of cells 300), and the spin accumulation lines 404 may be perpendicular to the read lines 406 and the write lines 402 (e.g., to address a column of cells 300). In another embodiment, the spin accumulation lines 404 may horizontally cross the read lines 406 and the write lines 402 at a non-perpendicular angle. For example, rows and columns may be oblique rather than perpendicular.

In the depicted embodiment, the write lines 402, write selectors 302, and polarizers 304 are shown as being below the spin accumulation lines 404, and the MTJs 320, read selectors 314, and read lines 406 are shown as being above the spin accumulation lines 404. For example, the write lines 402 may be deposited on a substrate for the array 400. However, in a certain embodiment, the cells 300 and the array 400 may be inverted (compared to their depicted orientation), so that read lines 406 are deposited on the substrate.

In certain embodiments, a controller, such as the die controller 206 of FIG. 2 may perform read operations and write operations for the array 400 by controlling voltages for the read lines 406, the write lines 402, and the spin accumulation lines 404. A controller may include or communicate with voltage generating components such as voltage drivers, level shifters or the like, voltage switching components such as transistors for coupling voltages to lines, sensing components such as sense amplifiers, latches to store sense amplifier outputs, and the like. Voltages for read and write operations are described in further detail below with reference to FIGS. 7-10.

Figure 5:
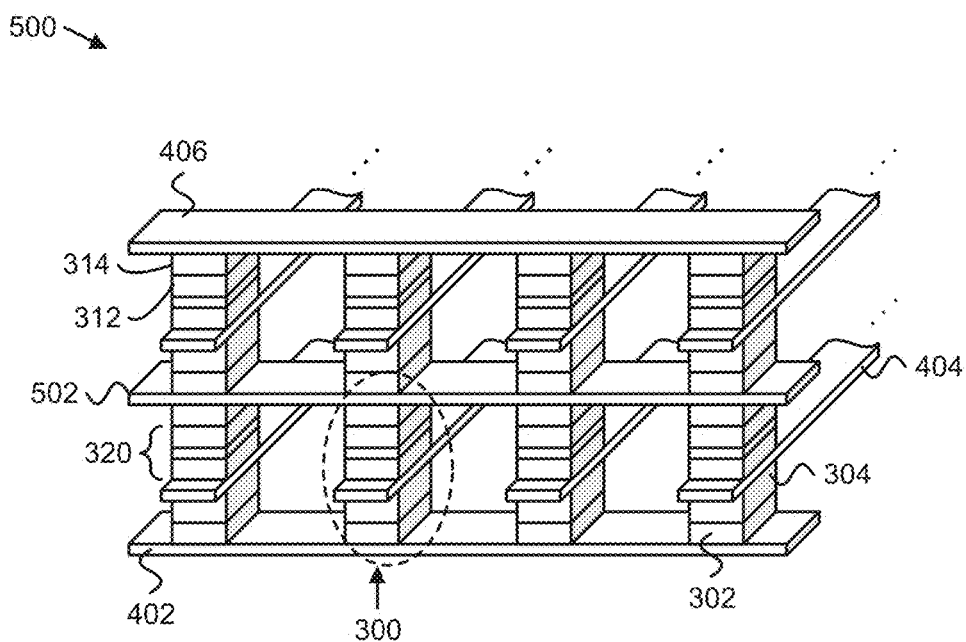
FIG. 5 is a perspective view illustrating another embodiment of an MRAM array.

FIG. 5 depicts another embodiment of an MRAM array 500. In certain embodiments, the MRAM array 500 may be substantially similar to the MRAM array 400 described above with reference to FIG. 4, including write lines 402, spin accumulation lines 404, read lines 406, and vertical MRAM cells 300. In the depicted embodiment, however, the array 500 is a three-dimensional array, including a plurality of MRAM cells 300 in a lower layer (as in FIG. 4) and a second plurality of MRAM cells 300 in an upper layer. Although two layers of MRAM cells 300 are depicted, a three-dimensional MRAM array 500 may include a larger number of layers.

In various embodiments, MRAM cells 300 in different layers may share read lines 406 and/or write lines 402. A line may be referred to as shared between layers if it is coupled to MRAM cells 300 in both layers. For example, as depicted in FIG. 5, line 502 is a shared line, coupled to MRAM cells 300 below and above the shared line 502. In the depicted embodiment, shared line 502 functions as a read line 406 for the lower layer of MRAM cells 300, because MTJs 320 are coupled between the shared line 502 and the spin accumulation lines 404 of the lower layer. Furthermore, in the depicted embodiment, shared line 502 functions as a write line 402 for the upper layer of MRAM cells 300, because polarizers 304 are coupled between the shared line 502 and the spin accumulation lines 404 of the upper layer. In another embodiment, a shared line 502 may function as a read line 406 for upper and lower layers, a write line 402 for upper and lower layers or the like. For example, alternating layers of MRAM cells 300 may be vertically inverted in each layer, relative to the previous layer, so that a shared line 502 is electrically connected only to read selectors 314, or only to write selectors 302 of the cells 300.

Figure 6:
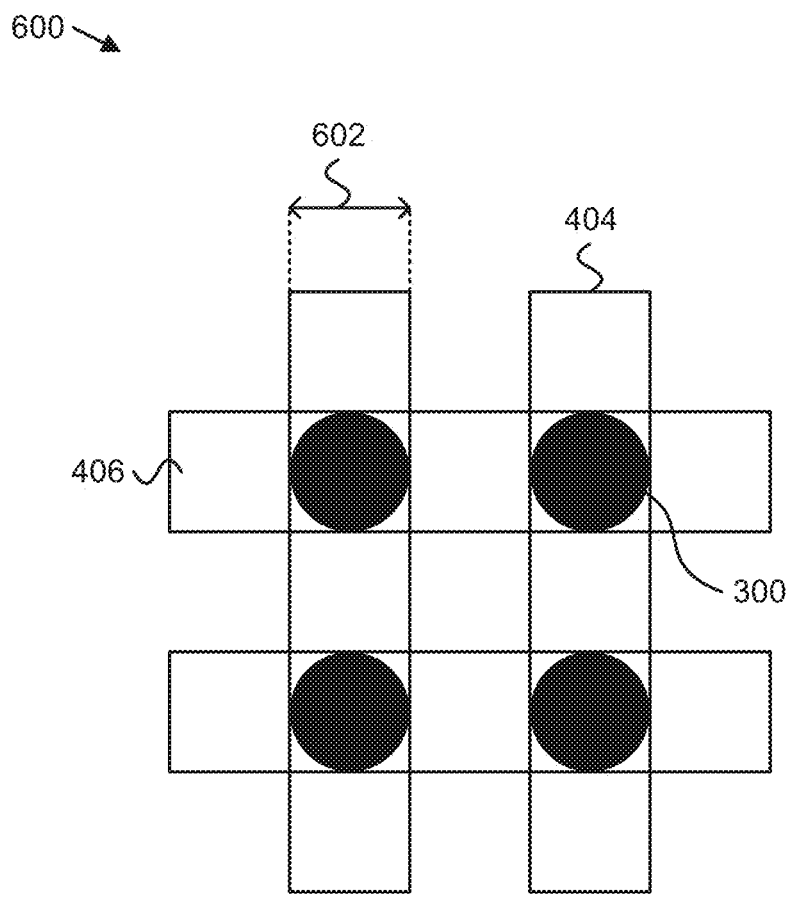
FIG. 6 is a top view illustrating a further embodiment of an MRAM array.

FIG. 6 depicts a top view of an MRAM array 600, which may be substantially similar to the MRAM arrays 200, 400, 500 described above, including vertical MRAM cells 300, read lines 406, spin accumulation lines 404, and write lines 402. In certain embodiments, write lines 402 may be directly below the read lines 406. Accordingly, write lines 402 are present in the array 600, but are not visible in the top view of FIG. 6.

In various embodiments, a process feature size 602 (which may be abbreviated as "F") refers to a characteristic size produced by a photolithographic process, which may be the minimum size for a feature produced by the photolithographic process. For example, a process with a 10 nm features size 602 may produce a feature such as a line, a transistor gate, an MTJ 320, or the like with a width of 10 nm. Correspondingly a minimum area for a feature produced by the photolithographic process may be the square of the process feature size 602, or F^2.

In the depicted embodiment, the array 600 provides a 4*F^2 density of cells 300. That is, the area density of the cells 300 is four times the square of the process feature size F 602. In one embodiment, the read lines 406, spin accumulation lines 404, and write lines 402 in their respective layers have width F, and are separated by distance F, so that the linear density of lines is 2F, or two times the feature size 602, per line. Accordingly, disposing vertical MRAM cells 300 where the perpendicular lines cross provides an area density of the cells 300 of four times the square of the feature size 602. As described above, a vertical cell 300 may include vertically aligned write selectors 302, polarizers 304, magnetic tunnel junctions 320, and read selectors 314. By contrast, if components such as selectors 302, 314 or switch transistors (instead of selectors 302, 314) occupy an area greater than F^2, or are not vertically aligned, cells 300 may be pushed further apart to accommodate the larger or non-aligned components, and the area used by each cell 300 may be greater than 4*F^2.

In certain embodiments, the average density of cells 300 for an MRAM die 150 may be affected by peripheral components such as row circuits 202, column circuits 204, and the die controller 206. However, the area density of the cells 300 may refer to the density of cells 300 within the array 600, excluding components external or peripheral to the array 600.

FIGS. 7-10 illustrate read and write voltages for an MRAM array 700, which may be substantially similar to the MRAM arrays 200, 400, 500, 600 described above, including MRAM cells 300, read lines 406, spin accumulation lines 404, and write lines 402. In the depicted embodiment, the read selectors 314 are unipolar selectors, illustrated as diodes, which permit current in one direction in response to a voltage satisfying a threshold (e.g., at least the on-voltage for the diode), but limit current if the voltage is below the threshold or in a reverse-biased direction. As described above, the write selectors 302 are bipolar selectors, depicted as diode pairs. The polarizers 304 are depicted as blocks, and the MTJs 320 are depicted as variable resistors due to the different resistances for the MTJ 320 in the parallel and antiparallel states.

A controller, such as the die controller 206, performs read operations and write operations for the array 700 by controlling voltages for the read lines 406, the write lines 402, and the spin accumulation lines 404. FIGS. 7-10 depict read and write voltages for reading from or writing to a selected cell 300, indicated by a dashed line. Cells 300 other than the selected cell 300 may be referred to as half-selected if they are in the same row or the same column as the selected cell 300 (e.g., coupled to the same read lines 406 and write lines 402, or to the same spin accumulation line 404), and may be referred to as unselected otherwise (e.g., an unselected cell 300 is coupled to different read lines 406, write lines 402, and spin accumulation lines 404 than a selected cell 300). Polarizers 304 and MTJs 320 may similarly be referred to as selected, half-selected, or unselected based on whether they are in selected, half-selected or unselected cells 300.

Figure 7:
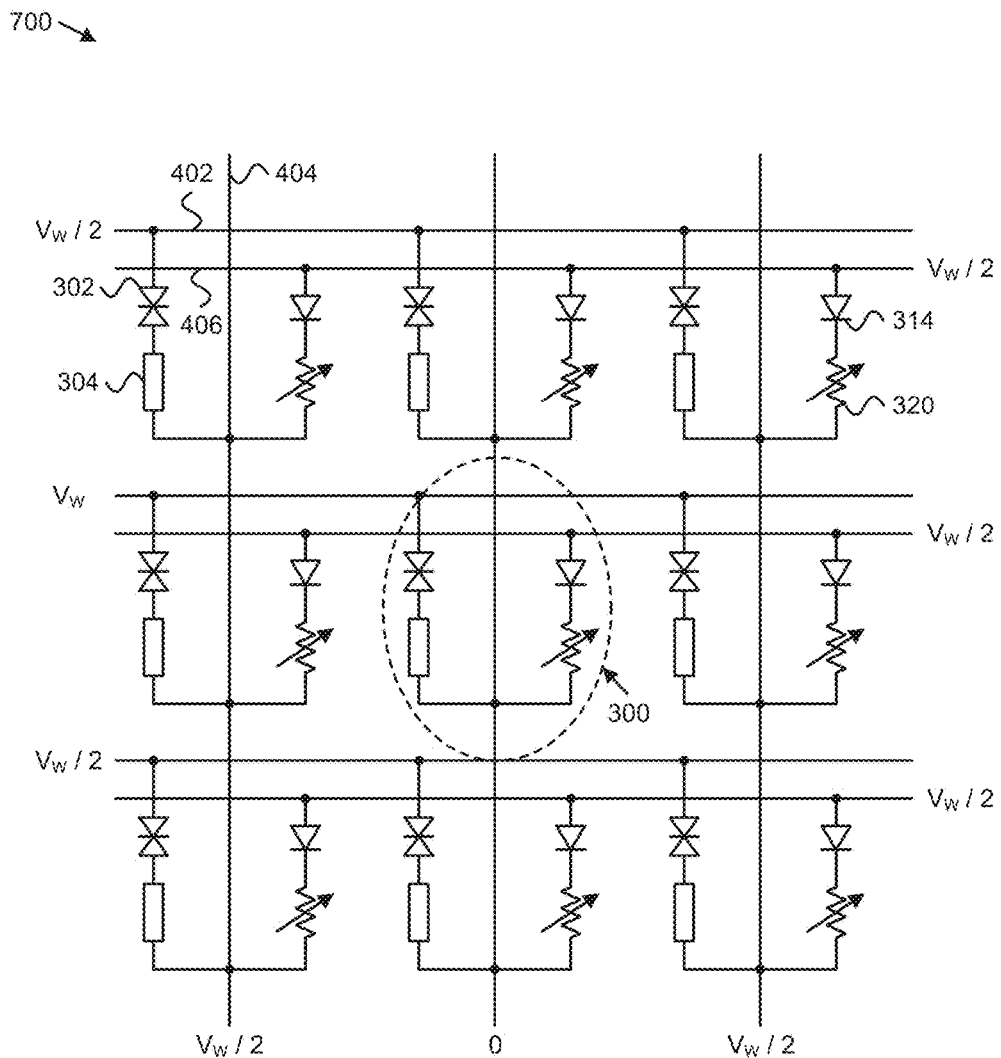
FIG. 7 is an electrical schematic illustrating one embodiment of write voltages for an MRAM array.

FIG. 7 depicts write voltages applied by a controller for a write operation, for writing a first bit value to the selected cell 300. The first bit value may be a binary zero or a binary one, depending on the orientation of magnetic moments within the cell 300, a convention adopted for which values are represented by the parallel or antiparallel states, or the like. The other value (e.g., a one if the first value is a zero, or a zero if the first value is a one) is referred to as a second bit value.

In the depicted embodiment, the controller performs a write operation for writing a first bit value to a selected cell 300 by coupling a write voltage $V_W$ to a write line 402 for the selected cell 300, grounding a spin accumulation line 404 for the selected cell 300, and coupling half the write voltage ($V_W/2$) to other write lines 402, other spin accumulation lines 404, and the read lines 406. The ground voltage is depicted as zero, in FIGS. 7-10. However, in various embodiments, the ground voltage may be any reference voltage, and other voltages such as the write voltage may be voltage differences above or below the reference voltage.

In the depicted embodiment, the voltage drop across the write selector 302 and the polarizer 304 for the selected cell 300 is equal to the write voltage $V_W$. The voltage drop across half-selected polarizers 304 (and write selectors 302) is equal to half the write voltage, or $V_W/2$. The voltage drop across unselected polarizers 304 (and write selectors 302) is equal to zero. The write selectors 302 may be configured so that the write voltage $V_W$ satisfies the voltage threshold, allowing current to flow through the selected polarizer 304 for writing to the selected MTJ 320. The write selectors 302 may further be configured so that half the write voltage ($V_W/2$) does not satisfy the voltage threshold, thus limiting current through the half-selected or unselected polarizers 304. The voltage drop across the MTJs 320 is $V_W/2$ or zero, and the read selectors 314 are configured with a higher threshold voltage than $V_W/2$, so the read selectors 314 limit current through the MTJs 320.

Figure 8:
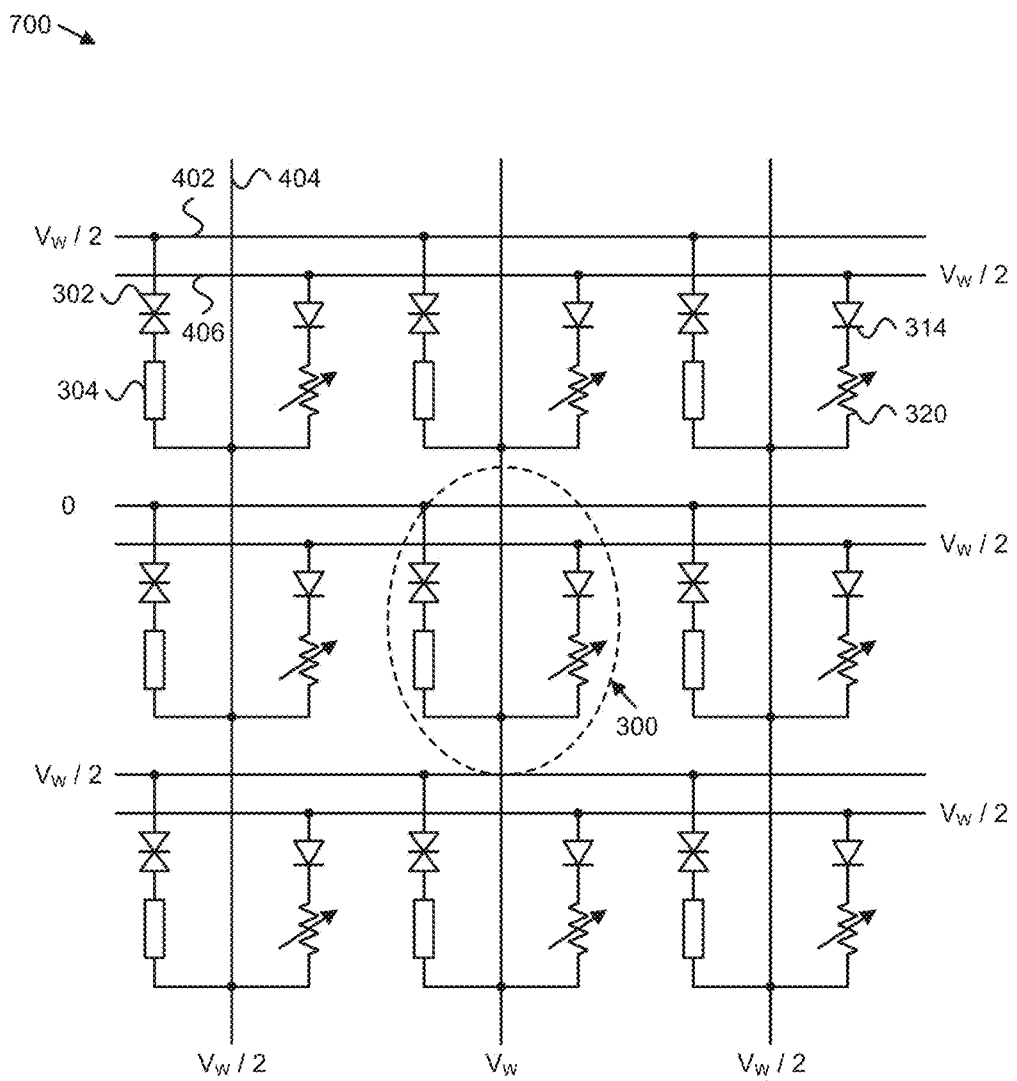
FIG. 8 is an electrical schematic illustrating another embodiment of write voltages for an MRAM array.

FIG. 8 depicts write voltages applied by a controller for a write operation, for writing a second bit value to the selected cell 300. The second bit value is the opposite of the first bit value.

In the depicted embodiment, the controller performs a write operation for writing the second bit value to a selected cell 300 by coupling a write voltage $V_W$ to the spin accumulation line 404 for the selected cell 300, grounding the write line 402 for the selected cell 300, and coupling half the write voltage ($V_W/2$) to other write lines 402, other spin accumulation lines 404, and the read lines 406.

In the depicted embodiment, the voltage drop across the write selector 302 and the polarizer 304 for the selected cell 300 is equal to the write voltage, in the opposite direction as in FIG. 7 ($-V_W$). The voltage drop across half-selected polarizers 304 (and write selectors 302) is half the write voltage in the opposite direction as in FIG. 7, or $-V_W/2$. The voltage drop across unselected polarizers 304 (and write selectors 302) is still equal to zero. The write selectors 302 may be bipolar selectors that permit current in both directions, based on thresholds, and may be configured so that the voltage $-V_W$ satisfies a voltage threshold, allowing current to flow through the selected polarizer 304 for writing to the selected MTJ 320. The write selectors 302 may further be configured so that the voltage $-V_W/2$ does not satisfy the voltage threshold, thus limiting current through the half-selected or unselected polarizers 304. The voltage drop across the MTJs 320 is $-V_W/2$ or zero, and the read selectors 314 may be unipolar selectors that limit current in response to a reverse bias. Alternatively, read selectors 314 may be bipolar selectors, with a threshold for reverse current flow that is not satisfied by a voltage of $-V_W/2$, so that the read selectors 314 limit current through the MTJs 320.

Figure 9:
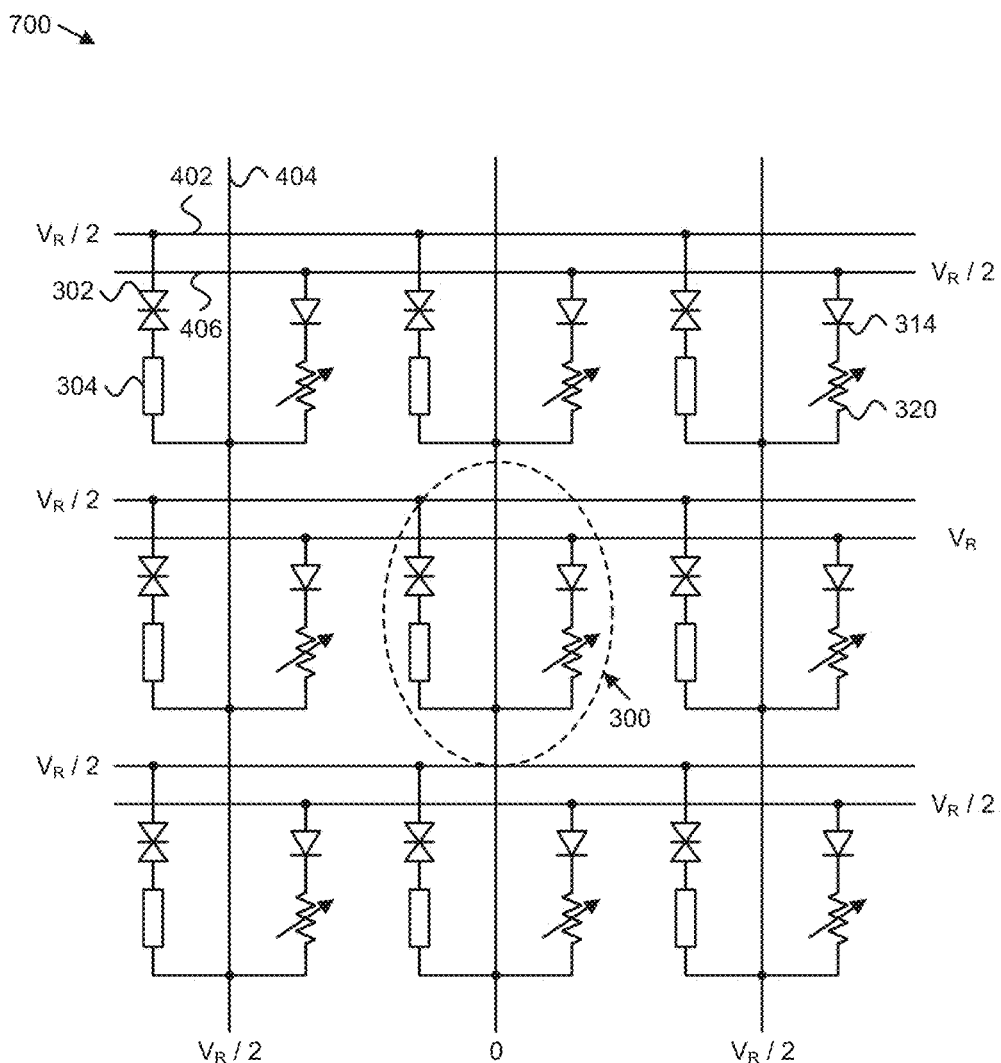
FIG. 9 is an electrical schematic illustrating one embodiment of read voltages for an MRAM array.

FIG. 9 depicts read voltages applied by a controller for a read operation, for reading data from the selected cell 300. In the depicted embodiment, the controller performs a read operation for a selected cell 300 by coupling a read voltage $V_R$ to the read line 406 for the selected cell 300, grounding the spin accumulation line 404 for the selected cell 300, and coupling half the write voltage ($V_R/2$) to other read lines 406, other spin accumulation lines 404, and the write lines 402.

In the depicted embodiment, the voltage drop across the read selector 314 and the MTJ 320 for the selected cell 300 is equal to the read voltage $V_R$. The voltage drop across half-selected MTJs 320 (and read selectors 314) is equal to half the read voltage, or $V_R/2$. The voltage drop across unselected MTJs 320 (and read selectors 314) is equal to zero. The read selectors 314 may be configured so that the read voltage $V_R$ satisfies the voltage threshold, allowing current to flow through the selected MTJ 320 for sensing the resistivity (and therefore the stored data value) of the selected MTJ 320. The read selectors 314 may further be configured so that half the read voltage ($V_R/2$) does not satisfy the voltage threshold, thus limiting current through the half-selected or unselected MTJs 320. The voltage drop across the polarizers 304 is $V_R/2$ or zero, and the write selectors 302 are configured with a higher threshold voltage than $V_R/2$, so the write selectors 302 limit current through the polarizers 304.

In certain embodiments, the read voltage $V_R$ may equal the write voltage $V_W$. As described above, the threshold voltage for a read selector 314 may be satisfied by the read voltage $V_R$ but not by half the read voltage $V_R$, or half the write voltage $V_W$. Similarly, the threshold voltage for a write selector 302 may be satisfied by the write voltage $V_W$ (in either direction), but not by half the write voltage $V_W$ (in either direction), or half the read voltage $V_R$. Accordingly, the read voltage and the write voltage may be equal, or may be somewhat different. For example, a slightly lower read voltage $V_R$ may provide lower read currents, and reduced wear. Alternatively, read currents may be limited in another manner, such as by a resistance built into (or in series with) the read selector 314.

Figure 10:
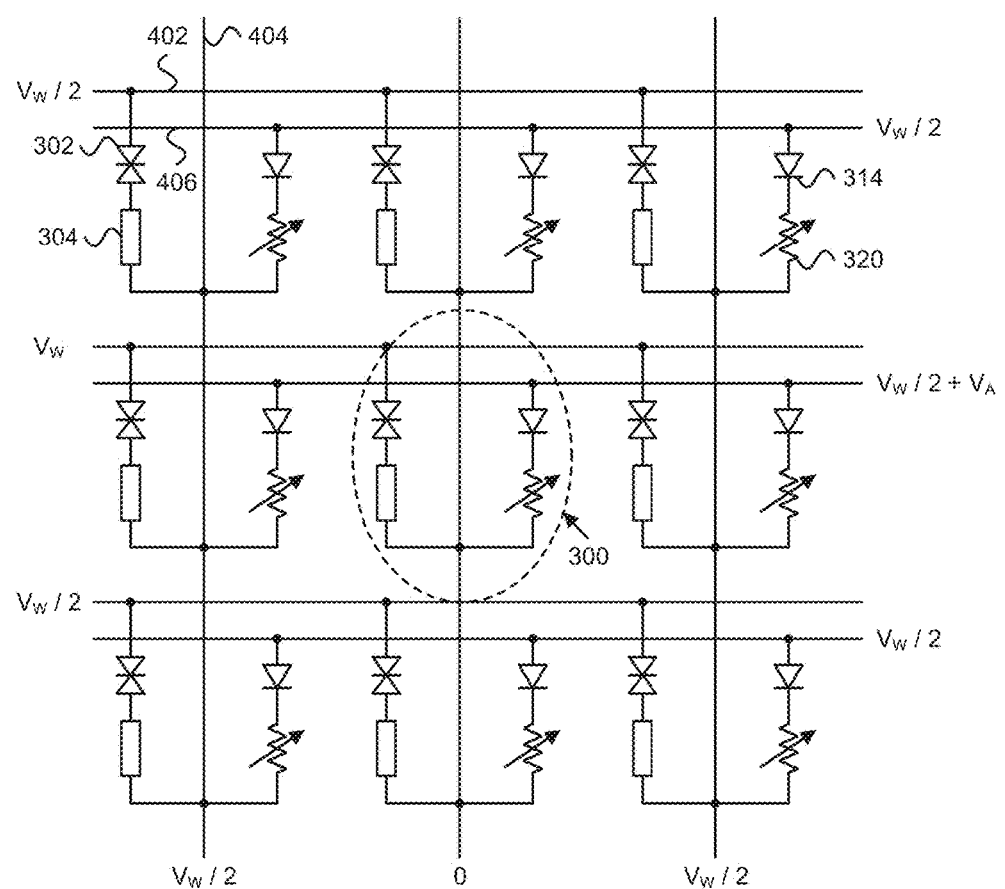
FIG. 10 is an electrical schematic illustrating one embodiment of write voltages for an MRAM array using voltage controlled magnetic anisotropy.

FIG. 10 depicts write voltages similar to FIG. 7, for writing a first bit value to a selected cell 300. In the depicted embodiment, the controller uses voltage controlled magnetic anisotropy to reduce write currents.

In various embodiments, a magnetic anisotropy of a cell 300 may refer to a difference between "easy" and "hard" axes for magnetizing the free layer 308. For example, in certain embodiments, a cell 300 with a perpendicular magnetization for the fixed layer 312 may have an "easy" axis in the perpendicular direction for the free layer 308, so that perpendicular magnetization for the free layer 308 is energetically favorable. A measurement of magnetic anisotropy may be the size of a field applied along the "hard" axis (e.g., in an in-plane direction) sufficient to cancel out the magnetization in the "easy" axis. Other or further measurements of magnetic anisotropy may similarly correspond to the difficulty of reading or writing to the cell 300. Thus, a cell 300 with a high magnetic anisotropy may provide stable data storage, but may use high write currents to change the magnetization of the free layer 308. By contrast, a cell 300 with a lower magnetic anisotropy may use lower write currents, but with a loss of some stability.

In certain embodiments, however, a voltage applied across an MTJ 320 may temporarily change the magnetic anisotropy of the free layer 308. In one embodiment, the magnetic anisotropy of the free layer 308 may be lowered by a voltage applied in one direction, and raised by a voltage applied in another direction. In further embodiments, using voltage controlled magnetic anisotropy (VCMA) involves applying a voltage across an MTJ 320 during writing, to temporarily reduce the magnetic anisotropy of the free layer 308, allowing lower write currents. Using VCMA may allow a cell 300 to be configured with high anisotropy, for stability, and with low write currents.

In the depicted embodiment, the controller applies voltages substantially as described above with reference to FIG. 7. However, the controller also applies a voltage greater than half the write voltage $V_W$ to a read line 406 for the selected cell 300, during the write operation. For example, in the depicted embodiments, the voltage on the read line 406 for the selected cell 300 is $V_W/2+V_A$: half the write voltage $V_W$, plus an additional bias voltage $V_A$. The additional bias voltage is selected so that $V_W/2+V_A$ satisfies the voltage threshold for the read selector 314, allowing current to flow. Additionally, the resistance of the read selector 314 may be lower than the resistance of the selected MTJ 320, so that most of the $V_W/2+V_A$ voltage drop between the read line 406 for the selected cell 300 and the spin accumulation line 404 for the selected cell 300 is across the selected MTJ 320 (rather than across the read selector 314 itself). The MTJ 320 may be configured so that voltage for the depicted polarity reduces the magnetic anisotropy of the free layer 308, thus facilitating faster and/or lower-current writing. However, voltage of the opposite polarity would increase the magnetic anisotropy of the free layer 308. Accordingly, VCMA may enable write current reduction for writing the first bit value, or for writing the second bit value, but not for both.

Figure 11:
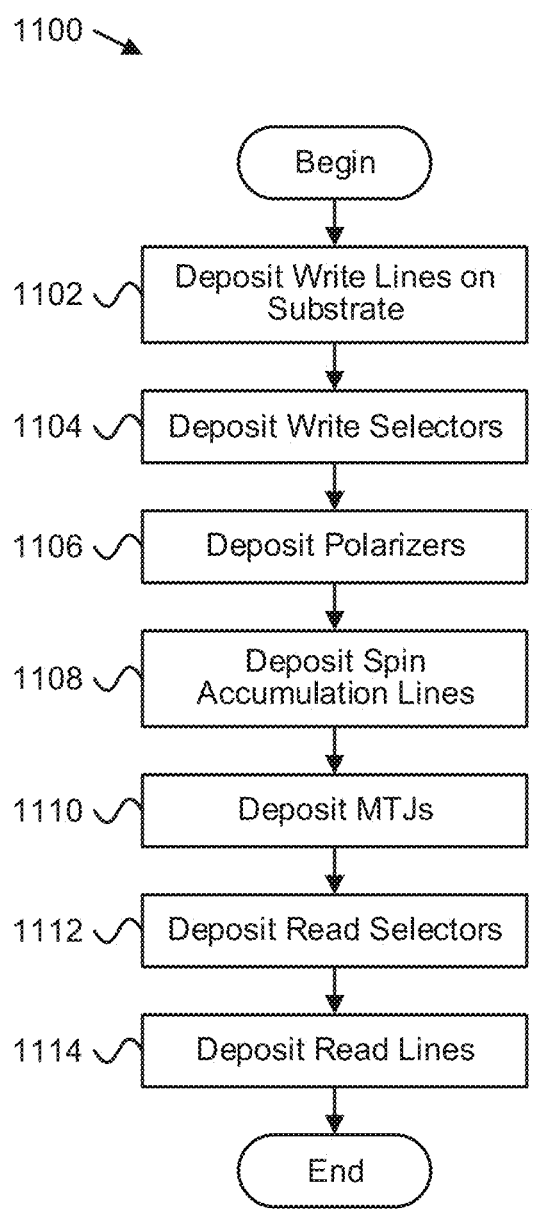
FIG. 11 is a schematic flow chart diagram illustrating one embodiment of a method for making an MRAM array.

FIG. 11 is a schematic flow chart diagram illustrating one embodiment of a method 1100 for making an MRAM array. The method 1100 begins, and a manufacturer deposits 1102 write lines 402 on a substrate. The manufacturer deposits 1104 write selectors 302 on the write lines 402. The manufacturer deposits 1106 polarizers 304 on the write selectors 302. The manufacturer deposits 1108 spin accumulation lines 404. The manufacturer deposits 1110 MTJs 320 on the spin accumulation lines 404. The manufacturer deposits 1112 read selectors 314 on the MTJs 320. The manufacturer deposits 1114 read lines 406, and the method 1100 ends.

Figure 12:
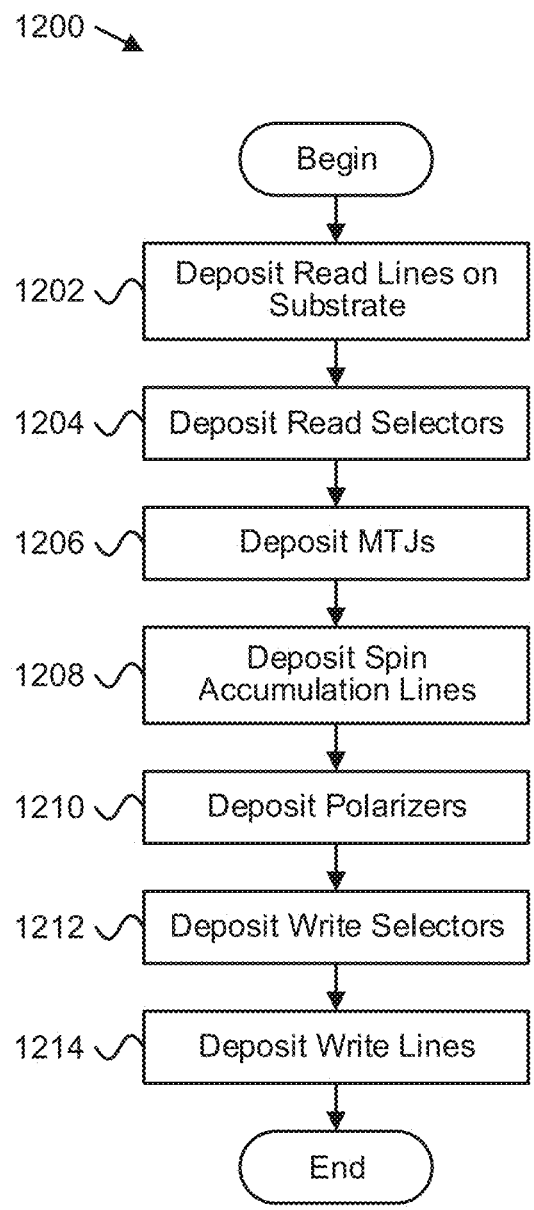
FIG. 12 is a schematic flow chart diagram illustrating another embodiment of a method for making an MRAM array.

FIG. 12 is a schematic flow chart diagram illustrating another embodiment of a method 1200 for making an MRAM array. The method 1200 begins, and a manufacturer deposits 1202 read lines 406 on a substrate. The manufacturer deposits 1204 read selectors 314 on the read lines 406. The manufacturer deposits 1206 MTJs 320 on the read selectors 314. The manufacturer deposits 1208 spin accumulation lines 404. The manufacturer deposits 1210 polarizers 304 on the spin accumulation lines 404. The manufacturer deposits 1212 write selectors 302 on the polarizers 304. The manufacturer deposits 1214 write lines 402, and the method 1200 ends.

A means for magnetoresistively storing a data value, in various embodiments, may include a magnetic tunnel junction 320, a fixed layer 312, a barrier layer 310, a free layer 308, a ferromagnetic material, a ferromagnetic alloy, a CoFeB alloy, or the like. Other embodiments may include similar or equivalent means for magnetoresistively storing a data value.

A means for accumulating magnetic spins adjacent to a means for magnetoresistively storing a data value, to change the stored data value, in various embodiments, may include a spin accumulation layer 306, a spin accumulation line 404, a conductive material, copper, silver, a copper/silver alloy, aluminum, graphene, or the like. Other embodiments may include similar or equivalent means for accumulating magnetic spins.

A means for spin-polarizing an electric write current to generate accumulated magnetic spins, in various embodiments, may include a polarizer 304, a spin-polarized ferromagnetic material, a cobalt/iron alloy, a cobalt/manganese alloy, or the like. Other embodiments may include similar or equivalent means for spin-polarizing an electric write current. In certain embodiments, means for magnetoresistively storing a data value, means for accumulating magnetic spins, and means for spin-polarizing may be vertically aligned in a cross-point magnetoresistive memory array.

A means for blocking write current, based on a first voltage failing to satisfy a threshold, in various embodiments, may include a write selector 302, a p-n junction, a p-n-p multilayer, ovonic threshold switching material, a bipolar selector, a metal-insulator-metal selector, a mixed ionic-electronic conduction composite selector, a metal-insulator transition selector, or the like. Other embodiments may include similar or equivalent means for blocking write current.

A means for blocking read current, based on a second voltage failing to satisfy a threshold, in various embodiments, may include a read selector 314, a p-n junction, a p-n-p multilayer, ovonic threshold switching material, a bipolar selector, a unipolar selector, a metal-insulator-metal selector, a mixed ionic-electronic conduction composite selector, a metal-insulator transition selector, or the like. Other embodiments may include similar or equivalent means for blocking read current. In certain embodiments, means for blocking the read current may be physically separated from a means for blocking the write current (e.g., disposed at non-adjacent portions of an MRAM cell 300).

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a plurality of read lines in a read line layer;
   a plurality of write lines in a write line layer;
   a plurality of spin accumulation lines in a spin accumulation line layer disposed between the read line layer and the write line layer, the spin accumulation lines horizontally crossing the read lines and the write lines; and
   a plurality of vertical magnetoresistive random access memory (MRAM) cells, a vertical MRAM cell comprising:
      a polarizer coupled between a spin accumulation line and a write line; and
      a magnetic tunnel junction coupled between the spin accumulation line and a read line, such that the magnetic tunnel junction and the polarizer are vertically aligned.

2. The apparatus of claim 1, wherein an area density of the vertical MRAM cells is four times a square of a process feature size, per cell.

3. The apparatus of claim 1, wherein the vertical MRAM cell further comprises a read selector disposed between the magnetic tunnel junction and the read line, and a write selector disposed between the polarizer and the write line.

4. The apparatus of claim 3, wherein the read selector and the write selector are vertically aligned with the polarizer and the magnetic tunnel junction.

5. The apparatus of claim 3, wherein the read selector comprises a unipolar selector and the write selector comprises a bipolar selector.

6. The apparatus of claim 1, wherein the read lines are parallel to the write lines, and the spin accumulation lines are perpendicular to the read lines and the write lines.

7. The apparatus of claim 1, wherein the magnetic tunnel junction comprises a fixed layer, a barrier layer, and a free layer, the barrier layer disposed between the fixed layer and the free layer, and the free layer in contact with the spin accumulation line.

8. The apparatus of claim 7, wherein a magnetic moment of the fixed layer, a magnetic moment of the free layer, and a magnetic moment of the polarizer are perpendicular to the barrier layer.

9. The apparatus of claim 1 wherein the spin accumulation line comprises one or more of silver, copper, aluminum, and graphene.

10. The apparatus of claim 1 wherein the polarizer comprises a spin-polarized ferromagnetic material.

11. The apparatus of claim 1, further comprising a second plurality of vertical MRAM cells, the plurality of vertical MRAM cells and the second plurality of vertical MRAM cells forming a three-dimensional array, wherein the second plurality of vertical MRAM cells shares one or more of the read lines and the write lines with the plurality of vertical MRAM cells.

12. The apparatus of claim 1, further comprising a controller that performs read operations and write operations on the vertical MRAM cells by controlling voltages for the read lines, the write lines, and the spin accumulation lines.

13. A system comprising:
a magnetoresistive random access memory (MRAM) array comprising:
a plurality of read lines;
a plurality of write lines;
a plurality of spin accumulation lines in a spin accumulation line layer disposed between the read lines and the write lines, the spin accumulation lines perpendicular to the read lines and the write lines; and
a plurality of MRAM cells, the MRAM cells comprising write selectors, polarizers, magnetic tunnel junctions, and read selectors, the write selectors and polarizers electrically coupled in series between the spin accumulation lines and the write lines, and the read selectors and magnetic tunnel junctions electrically coupled in series between the spin accumulation lines and the read lines; and
a controller that performs read operations and write operations for the array by controlling voltages for the read lines, the write lines, and the spin accumulation lines.

14. The system of claim 13, wherein the controller performs a read operation for a selected MRAM cell by coupling a read voltage to a read line for the selected cell, grounding a spin accumulation line for the selected cell, and coupling half the read voltage to other read lines, other spin accumulation lines, and the write lines.

15. The system of claim 13, wherein the controller performs a write operation for writing a first bit value to a selected cell by coupling a write voltage to a write line for the selected cell, grounding a spin accumulation line for the selected cell, and coupling half the write voltage to other write lines, other spin accumulation lines, and the read lines.

16. The system of claim 15, wherein the controller applies a voltage greater than half the write voltage to a read line for the selected cell, during the write operation.

17. The system of claim 15, wherein the controller performs a write operation for writing a second bit value to the selected cell, the second bit value different than the first bit value, by coupling the write voltage to the spin accumulation line for the selected cell, grounding the write line for the selected cell, and coupling half the write voltage to other write lines, other spin accumulation lines, and the read lines.

18. An apparatus comprising:
means for magnetoresistively storing a data value;
means for accumulating magnetic spins adjacent to the means for magnetoresistively storing a data value, to change the stored data value; and
means for spin-polarizing an electric write current to generate the accumulated magnetic spins,
wherein the means for magnetoresistively storing a data value, means for accumulating magnetic spins, and means for spin-polarizing are vertically aligned in a cross-point magnetoresistive memory array.

19. The apparatus of claim 18, further comprising means for blocking the write current based on a first voltage failing to satisfy a threshold.

20. The apparatus of claim 19, further comprising means for blocking a read current based on a second voltage failing to satisfy a threshold, wherein the means for blocking the read current is physically separated from the means for blocking the write current.

* * * * *